United States Patent [19]

Elmis et al.

[11] Patent Number: 4,504,799
[45] Date of Patent: Mar. 12, 1985

[54] DIGITAL FREQUENCY/PHASE LOCKED LOOP

[75] Inventors: Herbert Elmis, Denzlingen; Bernd Novotny, Gundelfingen, both of Fed. Rep. of Germany

[73] Assignee: ITT Industries, Inc., New York, N.Y.

[21] Appl. No.: 282,344

[22] Filed: Jul. 10, 1981

[30] Foreign Application Priority Data

Jul. 23, 1980 [DE] Fed. Rep. of Germany ....... 3027828

[51] Int. Cl.³ .......................... H03L 7/18; H03L 7/22
[52] U.S. Cl. .................................. 331/1 A; 331/11; 331/17; 331/20; 331/25; 331/27; 331/34; 358/158
[58] Field of Search ................. 331/1 A, 17, 18, 25, 331/27, 34, 11, 20; 455/260; 328/133, 134, 155; 358/158

[56] References Cited

U.S. PATENT DOCUMENTS

| 3,927,384 | 12/1975 | Jezo | 331/17 |
| 4,144,489 | 3/1979 | Ward et al. | 331/1 A X |
| 4,290,028 | 9/1981 | Legrand | 331/17 |
| 4,316,151 | 2/1982 | Doms | 331/1 A |
| 4,380,742 | 4/1983 | Hart | 331/27 X |
| 4,418,318 | 11/1983 | Swagerty et al. | 331/25 X |

Primary Examiner—Siegfried H. Grimm
Attorney, Agent, or Firm—Donald J. Lenkszus

[57] ABSTRACT

A frequency/phase locked loop for providing signals which are frequency and phase locked to signals at a reference frequency from a reference oscillator which is determinative of the frequency stability includes a frequency-controlled generator of a lower frequency stability. The frequency controlled generator is responsive to control signals for switching between first and second frequencies which are substantially higher than the reference frequency. The second frequency is approximately one to ten percent higher than the first frequency. The frequency divider coupled to the frequency generator provides an output signal at the same frequency as the reference oscillator. A digital phase comparator compares the outputs of the frequency divider with the reference signals. A digital integrating stage coupled to the comparator provides the control signals such that during a first portion of a period of the reference signals the first frequency is selected and during a second portion of the period the second frequency is selected.

35 Claims, 6 Drawing Figures

DIGITAL FREQUENCY/PHASE LOCKED LOOP

BACKGROUND OF THE INVENTION

1. Field of the Invention

The invention relates to frequency generation of synthesis using phase-locked loop circuitry.

2. Description of the Prior Art

Phase and frequency control by phase-locked loop techniques is known per se. Such regulating circuits are exhaustively described in the relevant literature, e.g. the text by R. Best "Theorie und Anwendungen des Phase-Locked Loops", Aarau/Switzerland, 1976. In the hitherto conventional types of frequency/phase-locked loops, the frequency-controlled generator is a voltage-controlled oscillator (VCO) while the phase comparator may either have an analog-linear characteristic, or may include digital hardware. The quite extensive patent literature relating to this art and also in other relevant literature reveals that in conventional frequency/phase-locked loops the frequency-controlled generator is invariably an analog voltage-controlled generator. Although satisfactory performance from analog VCO circuits can be obtained, there is always need for simple, low-cost, high performance alternatives. The manner in which the invention addresses this need will be evident as this description proceeds.

SUMMARY OF THE INVENTION

The improved low-cost, easily implemented circuit of the invention provides a novel and effective approach to frequency/phase-locked loop circuitry in that the generator is controlled between two discrete frequencies differing from each other by no more than 10%. The function of the usual analog low-pass filter as known from conventional arrangements is realized as a digital integrating stage whose output signal takes over the digital control of the frequency-controlled generator in a unique manner to be explained hereinafter.

According to a further embodiment of the invention, the switchable generator can be realized with the aid of an additional phase-locked loop comprising an analog voltage-controlled oscillator, whose rf generator oscillates at a single frequency, and which contains a frequency divider capable of being switched between two division numbers associated with the two frequencies of the frequency-controlled generator. When designing the rf generator as a synchronized crystal oscillator, the frequency/phase-locked loop according to the invention can be used in color television receivers as a subcircuit for generating the synchronized horizontal deflection signal, with the reference oscillator being formed by the horizontal sync pulse separating stage (sync separator).

The invention will now be explained in greater detail with reference to FIGS. 1 to 6 of the accompanying drawings.

DETAILED DESCRIPTION OF THE PREFERRED EMBODIMENTS

Figure 1:
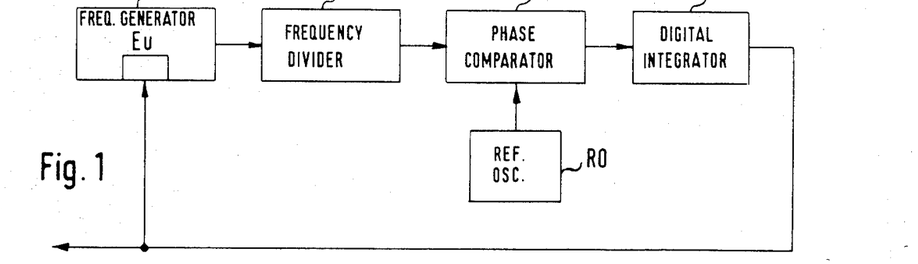
FIG. 1 presents a basic block diagram of the frequency/phase-locked loop according to the invention.

In the block diagram of FIG. 1, the frequency-controlled generator GN is capable of being switched between the two frequencies $f_1$ and $f_2$ via its switching input Eu, with the second frequency $f_2$ differing by about 1 to 10% from the first frequency $f_1$. This generator GN may be of any known type, for example, an LC-, RC-, or RL-oscillator, with one of the frequency-determining means being electronically switched via the switching input Eu between the two values respectively determinative of the two frequencies $f_1$ and $f_2$.

The output of the generator GN is connected to the input of the frequency divider FT by which the frequency of the generator output signal is stepped down to the frequency of the output signal of the reference oscillator RO, thus permitting the phase comparator PD to form the regulating signal from these two signals. In case the frequency/phase-locked loop is used in frequency synthesizing systems, the frequency divider FT is an adjustable one, thus permitting the frequency of the switching signal to become adjustable.

The output signal of the phase comparator PD is averaged in terms of time in the digital integrating stage DI, and is processed into the aforementioned switching signal as applied to the switching input Eu of the generator GN.

From the switchability of the generator GN between the two frequencies differing from one another by a maximum of about 10%, there results the essential advantage that the resolution power, hence the minimum step width of the frequency/phase regulation will correspond to the difference between the two frequencies. Considering that this difference at least amounts to about 1% of the higher one of the two frequencies, the step width is approximately, by the maximum factor 100, better than the period of this frequency.

Figure 2:
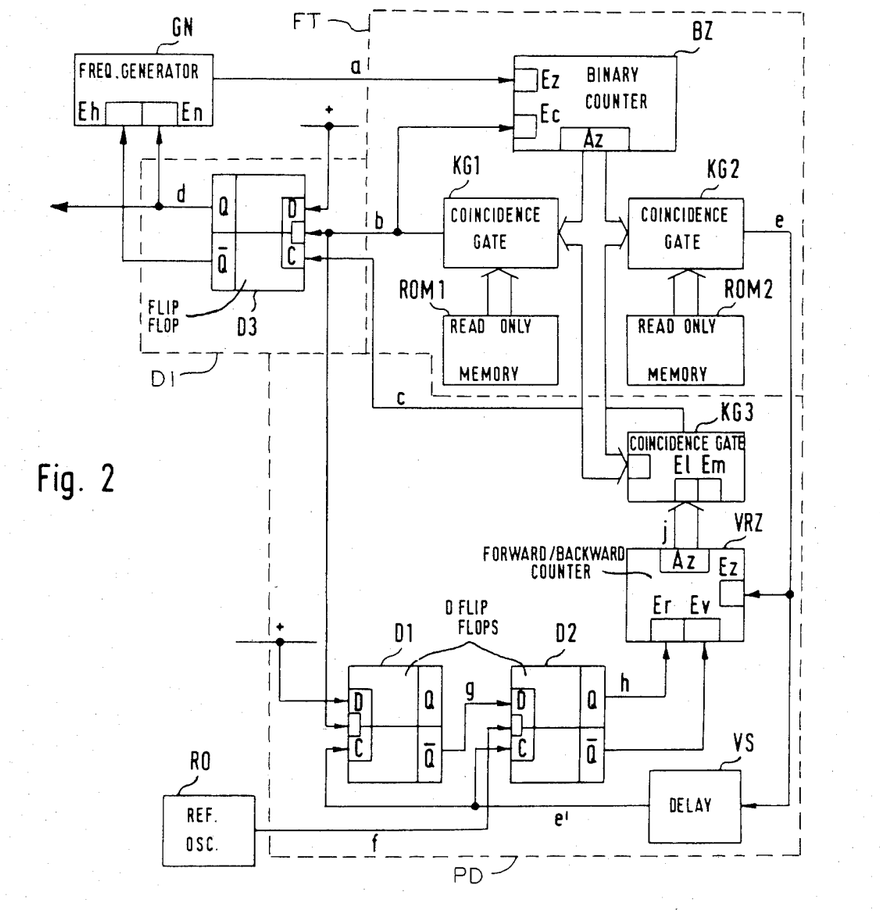
FIG. 2 shows a further embodiment of the arrangement of FIG. 1 comprising the switching means necessary for realizing both the digital phase comparator and the digital integrator.

The block diagram of FIG. 2 shows a variation of the arrangement according to FIG. 1. Here, the generator GN is again provided with switching inputs which now are realized as an enabling input Eh for the higher frequency $f_2$ and as an enabling input En for the lower frequency $f_1$. The frequency divider FT according to FIG. 1 is realized in FIG. 2 as a binary counter BZ having at least n-stages, to the counting input Ez of which there is applied the output signal "a" of the generator GN. The binary counter BZ may also have n+1 stages.

Figure 3:
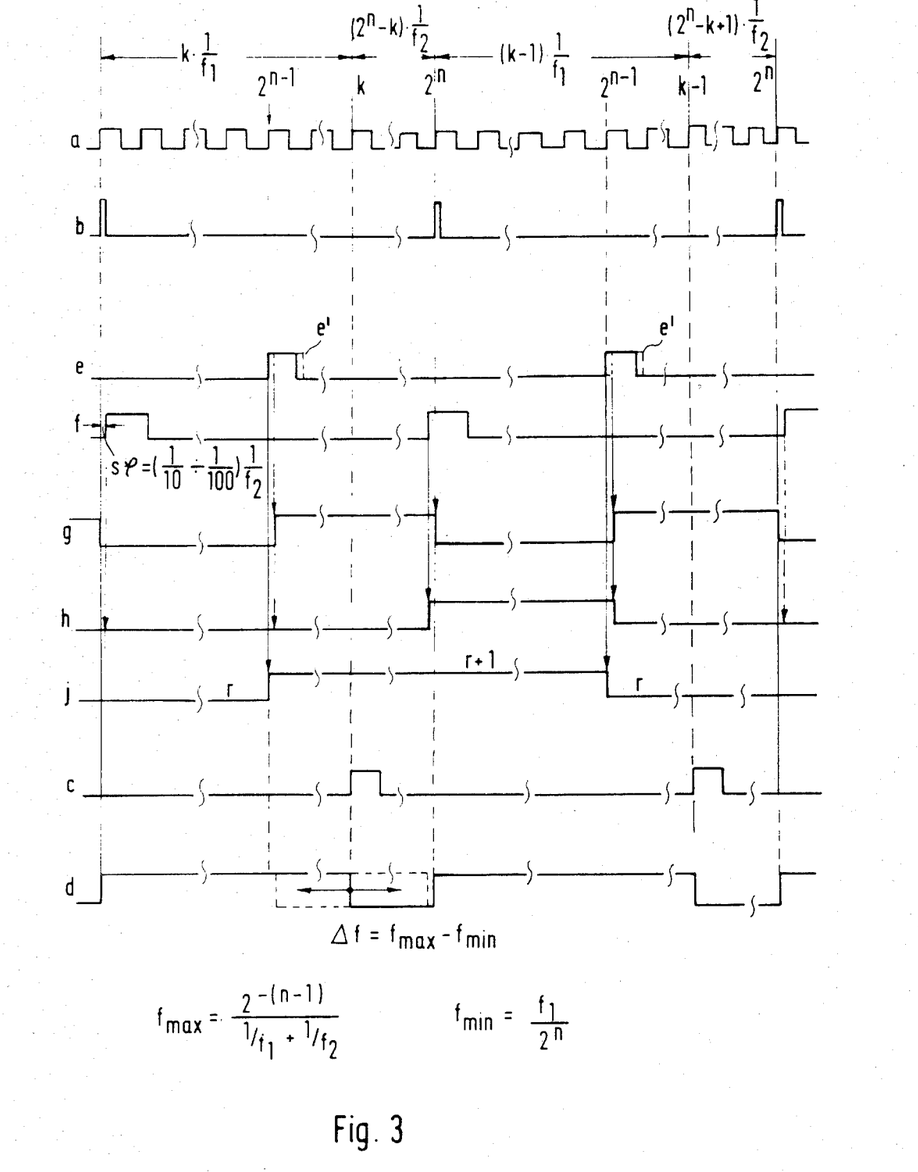
FIG. 3 depicts various pulse diagrams and time relationships as occurring during the operation of the arrangement of FIG. 2.

FIG. 3a shows the waveform and timing of output signal "a" of the generator GN. The pulses will be seen to occur during two cycles of the binary counter BZ. The binary counter BZ counts to $2^2$ and, during the first cycle, is capable of counting k pulses of the lower frequency $f_1$, and $2^n-k$ pulses of the higher frequency $f_2$. In contrast, during the second cycle of the counter BZ there are counted $k-1$ pulses of the lower frequency $f_1$ and $2^n-(k+1)$ pulses of the higher frequency $f_2$. Accordingly, the counting cycle duration of the binary counter BZ is greater by the aforementioned frequency difference during the first cycle than during the second cycle.

The outputs of the binary counter BZ are connected in parallel with the n first inputs of the first, the second, and the third coincidence gates KG1, KG2, KG3, respectively, with this being indicated by the wide signal lines in FIG. 2. The n secondary inputs of the first coincidence gate KG1 are connected to the outputs of the first read-only memory ROM1 in which the number $2^n$ is stored. Accordingly, the first coincidence gate KG1 always transmits an output pulse when the binary counter BZ has reached or passes through the count $2^n$. This output pulse is fed to its resetting input Ec and is depicted in FIG. 3b. This measure is important especially when the number of stages of the binary counter is chosen to be greater than n.

The n secondary inputs of the second coincidence gate KG2 are applied to the outputs of the second read-only memory ROM2 in which the number $2^{n-1}$ is stored, so that an output pulse will appear at the output of the second coincidence gate KG2 when the binary counter BZ reaches or passes through the count $2^{n-1}$. This output signal is shown in FIG. 3e and is fed to the counting input Ez of the (n−1)-stage forward/backward ("up/down") binary counter VRZ. The stage outputs thereof are applied in parallel to the n−1 least significant inputs E1 of the n other inputs of the third coincidence gate KG3, with the most significant input Em thereof being permanently set to the binary "one".

Moreover, and via the delay stage VS which, for example, may consist of two series-arranged inverter stages, the output signal "e" of the second coincidence gate KG2 is fed to the respective resetting input C of the first and the second D flip-flops D1 and D2 as the signal e' (see FIG. 3e).

The clock signal input of the first D flip-flop D1 is connected to the output of the first coincidence gate KG1 while its D-input is permanently applied to a constant positive potential. Accordingly, upon each output pulse "b" of the first coincidence gate KG1 a binary "one" is taken over into the first D flip-flop D1 where it remains until the delayed signal e', via the resetting input C, again erases this "one". At the $\overline{Q}$-output of the first D flip-flop D1 there appears the signal g which is inverse in relation to the just described operation of flip-flop D1, as also shown at FIG. 3g. This output signal from $\overline{Q}$ of D1 is fed to the D-input of the second D flip-flop D2, with the clock signal input thereof being connected to the output of the reference oscillator RO (the reference signal "f" as shown in FIG. 3f). In response to each pulse of the delayed signal e', the second D flip-flop D2 takes over either a binary "one" or a binary "zero" from the $\overline{Q}$-output of the D flip-flop D1. The binary value taken over depends on the phase position between the output signal "b" of the first coincidence gate KG1 and the reference signal "f".

In FIGS. 3f and 3g of FIG. 3 the two possibilities are shown as respectively occurring during the two shown counter cycles of the binary counter BZ. During the first cycle of the counter the output signal "b" appears at a time prior to the pulse of the reference signal f, i.e. during the preceding cycle of the counter the cycle period was shorter than the period of the reference pulses. By the leading edge of the signal "b", the binary "one" is taken over into the D flip-flop D1, of FIG. 3g, in which, accordingly, at this time position there appears at the $\overline{Q}$-output of D1 the lower signal level characterizing the binary zero state in the assumed positive logic.

Arrival of the delayed signal e' causes the first D flip-flop D1 to be reset, so that the binary "one" will appear at the $\overline{Q}$-output thereof. This binary "one" is taken over by the D flip-flop D2 in response to the next pulse of the reference signal f.

The binary "one" thus appearing at the Q-output of the second D flip-flop D2 will cause the forward/backward binary counter VRZ to be switched to backward counting because the Q-output is connected to its enabling input Er for the backward counting and, accordingly, the next occurring output pulse "e" of the second coincidence gate KG2 is counted in the backward direction. In the same way the binary "one" at the $\overline{Q}$-output of the second D flip-flop D2, via the enabling input Ev for the forward counting, causes the forward/backward binary counter VRZ to count the then following output pulse "e" of the second coincidence gate KG2 in the forward direction.

In accordance with the foregoing, it is seen that the two D flip-flops D1, D2, in conjunction with the forward/backward binary counter VRZ, detect a phase shift between the duration of one cycle of the binary counter and the period of the reference pulses and, together with the third coincidence gate KG3 and the third D flip-flop D3, cause the generator GN to be switched in such a way between the two frequencies $f_1$ and $f_2$, that this phase difference is substantially zero.

The outputs Az of the stages of the forward/backward binary counter VRZ are applied in parallel to the n−1 least significant inputs E1 of the n other inputs of the third coincidence gate KG3 whose most significant input Em is permanently set to the binary "one" and whose output signal "c" is fed to the resetting input C of the third D flip-flop D3 (again see FIG. 3c). To the count r of the forward/backward binary counter VRZ as supervised by the coincidence gate KG3 there applies with the definition chosen in the legend of FIG. 3, the relationship $r = k - 1 - 2^{n-1}$.

The takeover of the binary "one" into the third D flip-flop D3 as caused by the output signal "b" of the first coincidence gate KG1, is erased again by the output signal "c" of the third coincidence gate KG3 after the binary counter BZ has reached the count r of the forward/backward binary counter VRZ, as indicated in the waveform relationship of FIGS. 3c vis-a-vis 3g. Accordingly, the binary "one" as applied to the enabling input En for the lower frequency $f_1$ of the generator GN, is obtained from the Q-output of the third D flip-flop D3, so that generator GN oscillators at that frequency during the period of the binary "one". In FIG. 3, this corresponds to the first k pulses during the first cycle of the binary counter BZ.

The $\overline{Q}$-output of the third D flip-flop D3 is connected to the enabling input Eh of GN for the higher frequency $f_2$, i.e. accordingly, during the reset state of the third D flip-flop D3, the generator GN generates the higher frequency $f_2$. During the first cycle of the binary counter BZ, the latter counts the remaining $2^{n-k}$ steps at the higher frequency $f_2$. During the second cycle of the binary counter BZ, the switching is accomplished after k−n steps at the first frequency $f_1$, so that one more pulse of the higher frequency $f_2$ is counted.

The maximum frequency $f_{max}$ which, in the example according to FIG. 2, can still be accommodated is $2^{-(n-1)}/(1/f_1 + 1/f_2)$. The minimum frequency $f_{min}$, however, amounts to $(f_1)(2^{-n})$. When expressing the higher frequency $f_2$ as a sum of both the lower frequency $f_1$ and the frequency difference df, then the "trapping range" $\Delta f$ in the example of FIG. 2, amounts to:

$$f_{max} - f_{min} = \Delta f = df/(2^n(2 + df/f));$$
$$f_2 = f_1 + df_1 = f + df.$$

As already mentioned hereinbefore, in this the digital step width of the variation equals df.

Figure 4:
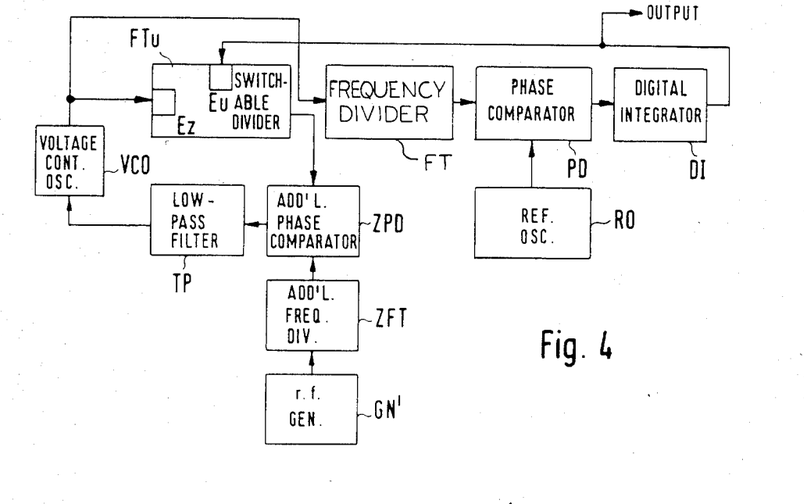
FIG. 4 shows additional aspects of the invention.

FIG. 4 shows the block diagram of an advantageous further embodiment of the arrangement according to FIGS. 1 and 2. In practice it may be required that the switching between the two frequencies $f_1$, $f_2$ of the generator GN is subject to special conditions in terms of time. Such conditions, for example, may occur when the frequency/phase-locked loop according to the invention is used with the horizontal synchronization in television receivers.

The further embodiment according to FIG. 4 substantially provides that, for realizing the generator GN according to FIGS. 1 and 2, there is additionally made use of the principle of the prior art phase-locked loops employing a voltage-controlled oscillator, with a modification to be described hereinafter. In the example shown in FIG. 4, the rf generator GN' of the additional phase-locked loop oscillates at a single frequency. The switching between the two frequencies $f_1$, $f_2$ is realized with the aid of the switchable frequency divider FTu to the switching input Eu of which the output signal of the digital integrating stage DI is applied. Thus, it is possible to eliminate switching of the frequency-determining components as contemplated in the generator GN as shown in FIGS. 1 and 2.

The switchable frequency divider FTu is capable of being switched between two integral adjacent division numbers m, m−1, with the greater division number m preferably being a power of two. If, for example, m=16 is chosen, then 15 is the smaller division number. Corresponding number pairs would also be 8 and 7 or 32 and 31 for m=8 and m=32, respectively. The output signal of the rf generator GN' is fed to the additional frequency divider ZFT dividing by the division number m, with the output signal thereof, together with that of the switchable frequency divider FTu, being applied to the two inputs of the additional phase comparator ZPD. The output signal of ZPD, via the low-pass filter TP, controls the voltage-controlled oscillator VCO. The output signal of the voltage controlled oscillation VCO is applied to the counting input Ez of the switchable frequency divider FTu and to the input of frequency divider FT. The frequency divider FT, phase comparator PD, and digital integrator DI operate as described in conjunction with FIGS. 1 and 2.

Figure 5:
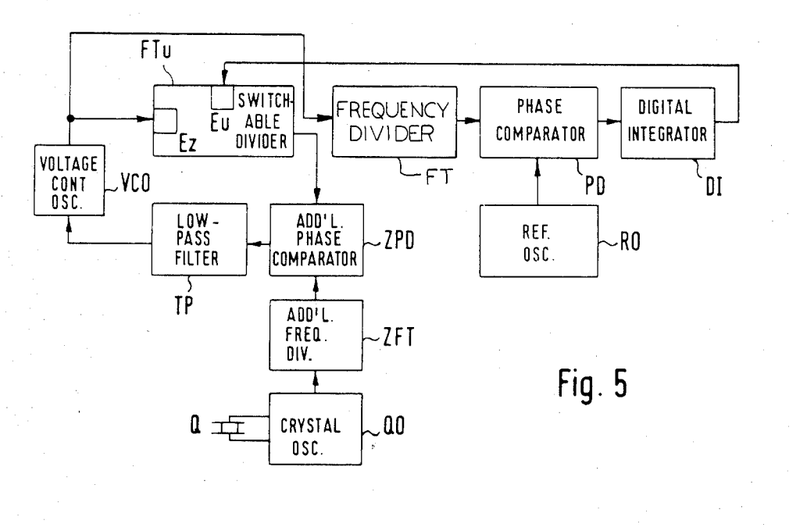
FIG. 5 shows the further embodiment according to FIG. 4 including the aforementioned crystal oscillator.

In the embodiment of FIG. 5, the equivalent of the rf generator GN' according to FIG. 4, oscillating at a single frequency, is shown as a crystal oscillator QO comprising the quartz crystal Q. FIG. 5 otherwise duplicates FIG. 4.

Figure 6:
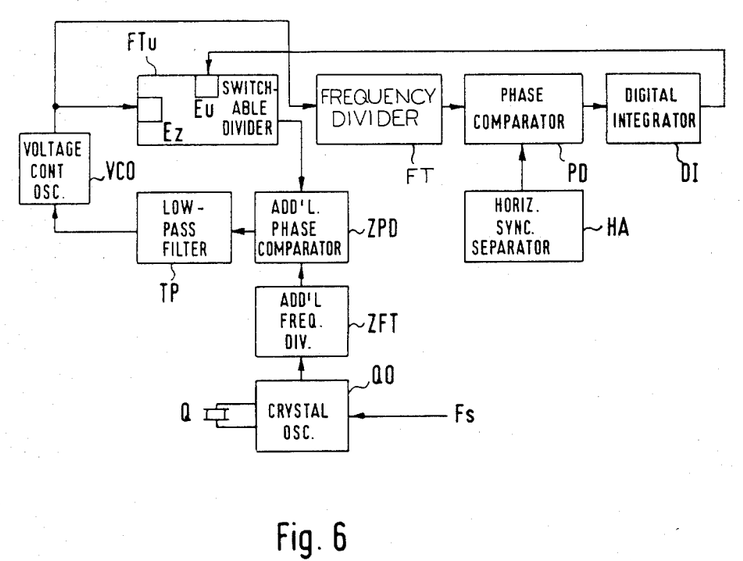
FIG. 6 shows a specific embodiment of the invention for use in a color television receiver.

FIG. 6 shows that the crystal oscillator QO is synchronized via a synchronizing signal Fs as is done, for example, by the color burst in the case of the color subcarrier oscillator in color television receivers. Accordingly, the embodiment of FIG. 6 is designed with a particular view to use in color television receivers, in which case the reference oscillator RO according to FIGS. 1, 2, 4 and 5 is constituted by the horizontal sync (pulse) separator HA. In this case the higher frequency $f_2$ equals the fourfold color subcarrier frequency amounting to about 17.7 MHz, and the lower frequency $f_1$, when m=16 is chosen at 16.6 MHz (in Europe: PAL-System) or amounting to about 14.4 MHz (in USA: NTSC-Syst.).

If, however, the crystal oscillator QO is not synchronized, as in black and white television receivers, for example, the switchable frequency divider FTu is switched in such a way between the division numbers m and m−1, that the sum of all periods during one line duration equals the total period duration of the received television signal. Accordingly, frequency jumping is no longer caused by the switching between the burst-synchronized and non-synchronized operation, because the output signals at the two frequencies $f_1$, $f_2$ are always locked into step (synchronized) with the output signal of the generator GN.

What is claimed is:

1. A frequency/phase locked loop comprising:
   a reference oscillator determinative of the frequency stability for providing reference signals at a reference frequency;
   a frequency-controlled generator of a lower frequency stability than said reference oscillator providing output signals at a first or a second frequency, said generator being responsive to control signals for switching between said first and second frequencies, said second frequency being approximately one to ten percent higher than said first frequency, said first and second frequency both being substantially higher than said reference frequency;
   a frequency divider coupled to said generator for generating an output signal of the same frequency as said reference oscillator;
   a digital phase comparator having a first input coupled to said reference oscillator, a second input coupled to the output of said frequency divider, and an output;
   a digital integrating stage coupled to said digital phase comparator output for providing said control signals whereby during a first portion of a period of said reference signal said control signals select said first frequency and during a second portion of said period said control signals select said second frequency.

2. A frequency/phase locked loop in accordance with claim 1, wherein said frequency divider comprises:
   a binary counter having at least n stages, each of said n stages having an output;
   first and second coincidence gate circuits, each having an output, n first inputs coupled to the output of said binary counter, and n second inputs;
   means for supplying the binary number $2^n$ to said first coincidence gate second inputs; and
   means for supplying the binary number $2^{n-1}$ to said second coincidence gate second inputs;
   and wherein said phase comparator comprises:
   a third coincidence gate having an output, n first inputs coupled to the outputs of said binary counter and n second inputs the nth most significant input being set to a binary one;
   an n−1 stage up/down binary counter having a count input coupled to said second coincidence gate output, n−1 outputs coupled to the n−1 least significant ones of said second inputs of said third comparator, an up count control input and a down count control input;

first and second D flip-flops each having a D input, a clock input, a reset input and first and second complementary outputs;

circuit means coupling said second coincidence gate output to said first and second flip-flop reset inputs;

said D input of said first flip-flop being coupled to a fixed potential, said first flip-flop clock input coupled to said first coincidence gate output, said second flip-flop D input coupled to said first flip-flop second output, said second flip-flop clock input coupled to said reference oscillator, said second flip-flop first output coupled to one of said up count or down count control inputs, said second flip-flop second output coupled to the other one of said up count or down count control inputs; and said digital integrating stage comprises: a D flip-flop having a D input coupled to a fixed potential, a reset input coupled to said third coincidence gate output, a clock input coupled to said first coincidence gate output, and outputs for supplying said control signals.

3. A frequency/phase-locked loop in accordance with claim 2, wherein said frequency controlled generator comprises:

a phase locked loop comprising:

an analog voltage-controlled oscillator;

a first frequency divider coupled to the output of said voltage controlled oscillator and responsive to said control signals for dividing the oscillator output by a first integral division number associated with said first frequency and for dividing the oscillator by a second integral adjacent division number associated with said second frequency;

a single frequency oscillator;

a second frequency divider having an input coupled to said single frequency oscillator for dividing the output of said single frequency oscillator by the greater of said first or second numbers;

a second phase comparator for comparing the phase of the output of said second frequency divider with the phase of the output of said first frequency divider for providing signals to control said voltage control oscillator.

4. A frequency/phase-locked loop in accordance with claim 1, wherein said frequency controlled generator comprises:

a phase locked loop comprising:

an analog voltage-controlled oscillator;

a first frequency divider coupled to the output of said voltage controlled oscillator providing said output signals at an output and responsive to said control signals for dividing the oscillator output by a first integral division number associated with said first frequency and for dividing the oscillator by a second integral adjacent division number associated with said second frequency;

a single frequency oscillator;

a second frequency divider having an input coupled to said single frequency oscillator for dividing the output of said single frequency oscillator by the greater of said first or second numbers;

a second phase comparator for comparing the phase of the output of said second frequency divider with the phase of the output of said first frequency divider for providing signals to control said voltage controlled oscillator.

5. A frequency/phase-locked loop in accordance with claims 3 or 4, wherein said greater of said first or second numbers is a power of 2.

6. A frequency/phase-locked loop in accordance with claims 3 or 4, wherein said single frequency oscillator comprises a crystal oscillator,.

7. A frequency/phase-locked loop in accordance with claim 6, wherein said crystal oscillator is synchronized by a further signal.

8. A frequency/phase-locked loop comprising:

a reference signal source for providing reference signals at a reference frequency;

a signal generator having a lower frequency stability than said reference signal source, said generator selectively providing first signals at a first or a second frequency, said generator being responsive to control signals for switching between said first and second frequencies, said second frequency being approximately one to ten percent higher than said first frequency, said first and second frequencies both being substantially higher than said reference frequency;

a frequency divider coupled to said generator for generating second signals at substantially the same frequency as said reference signals;

a digital phase comparator having a first input receiving said reference signals and a second input receiving said second signals for detecting phase shifts between said second signals and said reference signals; and a digital integrator coupled to the output of said digital phase comparator for providing said control signals, whereby during a first portion of a period of said reference signal said control signals select said first frequency and during a second portion of said period said control signals select said second frequency.

9. A frequency/phase locked loop in accordance with claim 8, wherein said frequency divider comprises:

a counter;

first logic means for providing a first output signal each time said counter reaches a first predetermined count;

second logic means for providing a second output signal each time said counter reaches a second predetermined count;

said phase comparator comprises:

an up/down counter coupled to said second logic means for counting each occurrence of said second output signal, said up/down counter being selectively operable to count up or down;

third logic means for generating a third output signal each time said counter reaches said first predetermined count and said up/down counter reaches a third predetermined state; and logic means responsive to said reference signals and said first and second output signals for selecting whether said up/down counter counts up or down; and wherein said digital integrator comprises a flip-flop clocked by said first output signal and reset by said third output signal.

10. A frequency/phase locked loop in accordance with claim 9, wherein said counter is a binary counter having at least n stages;

said first predetermined count is $2^n$;

said second predetermined count is $2^{n-1}$; and said third predetermined count is $2^{n-1}$.

11. A frequency/phase locked loop in accordance with claim 10, wherein said logic means comprises a first flip-flop clocked by said first output signal and reset by said second output signal; and a second flip-flop clocked by said reference signals and reset by said second output signal, an output of said first flip-flop being coupled to the input of said second flip-flop such that the state of said first flip-flop determines the state that said second flip-flop assumes upon occurrence of each of said reference signals, the state of said second flip-flop determining whether said up/down counter counts up or down.

12. A frequency/phase locked loop in accordance with claim 11 used in a television receiver for generating a synchronized horizontal deflection signal at an output terminal and wherein said reference signal source comprises a horizontal sync pulse separator for said receiver; and said digital integrator is coupled to said output terminal for providing said horizontal deflection signal.

13. A frequency/phase locked loop in accordance with claim 10 used in a television receiver for generating a synchronized horizontal deflection signal at an output terminal and wherein said reference signal source comprises a horizontal sync pulse separator for said receiver; and said digital integrator is coupled to said output terminal for providing said horizontal deflection signal.

14. A frequency/phase locked loop in accordance with claim 9, wherein said logic means comprises a first flip-flop clocked by said first output signal and reset by said second output signal; and a second flip-flop clocked by said reference signals and reset by said second output signal, an output of said first flip-flop being coupled to the input of said second flip-flop such that the state of said first flip-flop determines the state that said second flip-flop assumes upon occurrence of each of said reference signals, the state of said second flip-flop determining whether said up/down counter counts up or down.

15. A frequency/phase locked loop in accordance with claim 14 used in a television receiver for generating a synchronized horizontal deflection signal at an output terminal and wherein said reference signal source comprises a horizontal sync pulse separator for said receiver; and said digital integrator is coupled to said output terminal for providing said horizontal deflection signal.

16. A frequency/phase locked loop in accordance with claim 9 used in a television receiver for generating a synchronized horizontal deflection signal at an output terminal and wherein said reference signal source comprises a horizontal sync pulse separator for said receiver; and said digital integrator is coupled to said output terminal for providing said horizontal deflection signal.

17. A frequency/phase locked loop in accordance with claim 8, wherein said signal generator comprises:
   a single frequency oscillator;
   a second frequency divider coupled to the output of said single frequency oscillator; and
   a phase-locked loop comprising:
   a voltage controlled oscillator;
   a first frequency divider coupled to the output of said voltage controlled oscillator and responsive to said control signals for dividing the frequency of said voltage controlled oscillator output by a first integral number to generate said first signals at said first frequency or for dividing the frequency of said voltage controlled oscillator output by a second integral number adjacent said first integral number to generate said first signals at said second frequency; and
   a second phase comparator for comparing said first signals to signals at the output of said second frequency divider and generating voltage control signals for said voltage controlled oscillator.

18. A frequency/phase locked loop in accordance with claim 17, wherein said second frequency divider divides the frequency of said single frequency oscillator by the greater number of said first or second numbers.

19. A frequency/phase locked loop in accordance with claim 18, wherein said greater number is a power of 2.

20. A frequency/phase locked loop in accordance with claim 19, wherein said single frequency oscillator comprises a crystal oscillator.

21. A frequency/phase locked loop in accordance with claim 20, wherein said crystal oscillator is synchronized by a synchronization signal.

22. A frequency/phase locked loop in accordance with claim 19 used in a television receiver for generating a synchronized horizontal deflection signal at an output terminal and wherein said reference signal source comprises a horizontal sync pulse separator for said receiver; and said digital integrator is coupled to said output terminal for providing said horizontal deflection signal.

23. A frequency/phase locked loop in accordance with claim 18, wherein said single frequency oscillator comprises a crystal oscillator.

24. A frequency/phase locked loop in accordance with claim 23, wherein said crystal oscillator is synchronized by a synchronization signal.

25. A frequency/phase locked loop in accordance with claim 18 used in a television receiver for generating a synchronized horizontal deflection signal at an output terminal and wherein said reference signal source comprises a horizontal sync pulse separator for said receiver; and said digital integrator is coupled to said output terminal for providing said horizontal deflection signal.

26. A frequency/phase locked loop in accordance with claim 17, wherein the greater number of said first or second numbers is a power of 2.

27. A frequency/phase locked loop in accordance with claim 26, wherein said single frequency oscillator comprises a crystal oscillator.

28. A frequency/phase locked loop in accordance with claim 27, wherein said crystal oscillator is synchronized by a synchronization signal.

29. A frequency/phase locked loop in accordance with claim 26 used in a television receiver for generating a synchronized horizontal deflection signal at an output terminal and wherein said reference signal source comprises a horizontal sync pulse separator for said receiver; and said digital integrator is coupled to said output terminal for providing said horizontal deflection signal.

30. A frequency/phase locked loop in accordance with claim 17, wherein said single frequency oscillator comprises a crystal oscillator.

31. A frequency/phase locked loop in accordance with claim 30, wherein said crystal oscillator is synchronized by a synchronization signal.

32. A frequency/phase locked loop in accordance with claim 30 used in a television receiver for generating a synchronized horizontal deflection signal at an output terminal and wherein said reference signal source comprises a horizontal sync pulse separator for said receiver; and     said digital integrator is coupled to said output terminal for providing said horizontal deflection signal.

33. A frequency/phase locked loop in accordance with claim 32, wherein said crystal oscillator comprises a color subcarrier oscillator.

34. A frequency/phase locked loop in accordance with claim 17 used in a television receiver for generating a synchronized horizontal deflection signal at an output terminal and wherein said reference signal source comprises a horizontal sync pulse separator for said receiver; and     said digital integrator is coupled to said output terminal for providing said horizontal deflection signal.

35. A frequency/phase locked loop in accordance with claim 8 used in a television receiver for generating a synchronized horizontal deflection signal at an output terminal and wherein said reference signal source comprises a horizontal sync pulse separator for said receiver; and     said digital integrator is coupled to said output terminal for providing said horizontal deflection signal.

* * * * *